United States Patent [19]

Brossard et al.

[11] 4,369,512

[45] Jan. 18, 1983

[54] DIGITAL TRANSMISSION CIRCUIT USING MEANS FOR INTRODUCING A REDUNDANCY ON THE MOST SIGNIFICANT BIT

[76] Inventors: Pierre Brossard, 9 rue des Fleurs, Montigny le-Bretonneux 78190 Trappes; Didier Lombard, 223 rue de l'Universite, 75007 Paris, both of France

[21] Appl. No.: 199,867

[22] Filed: Oct. 23, 1980

[30] Foreign Application Priority Data

Nov. 14, 1979 [FR] France .............................. 79 28053

[51] Int. Cl.³ ............................................. G06F 11/10
[52] U.S. Cl. .................................................... 371/43
[58] Field of Search ......................... 371/43, 44, 45, 46

[56] References Cited

U.S. PATENT DOCUMENTS

| | | | |
|---|---|---|---|
| 3,508,197 | 4/1970 | Tong | 371/44 X |
| 4,055,832 | 10/1977 | En | 371/43 |
| 4,081,789 | 3/1978 | Markwitz | 371/46 |
| 4,110,735 | 8/1978 | Maxemchuk | 371/43 |
| 4,119,945 | 10/1978 | Lewis, Jr. et al. | 371/43 |

*Primary Examiner*—David H. Malzahn

[57] ABSTRACT

Coder-decoder for a transmission channel for digital signals, said signals being constituted by a sequence of bits between a more significant bit formed by a sign bit and a less significant bit.

The coder-decoder comprises on the one hand a coder constituted by a circuit able to extract the more significant bit e.g. 1 from the indicated incident digital signal, a recurrent coding circuit of ratio 2 receiving bit EB1 and supplying two redundant bits EB1a and EB1b, means for forming a coded signal having the same number of bits as the incident signal with bit EB1a as the most significant bit, the least significant bit of the incident signal being eliminated and bit EB1b being inserted between two given bits of the incident signal and on the other hand a decoder which comprises means for extracting the redundant bits EB1a and EB1b from the coded signal, a recurrent decoding circuit receiving the two bits EB1a and EB1b and supplying a sign bit EB1b, a pseudo-random bit generator and means for restoring a digital signal having the signal bits received other than EB1a and EB1b between the sign bit taken as the most significant bit and the pseudo-random bit taken as the least significant bit.

5 Claims, 5 Drawing Figures

DIGITAL TRANSMISSION CIRCUIT USING MEANS FOR INTRODUCING A REDUNDANCY ON THE MOST SIGNIFICANT BIT

BACKGROUND OF THE INVENTION

The present invention relates to a coder-decoder for digital transmission channels and is intended more particularly for use in digital telephony.

The presently used pulse-code modulators and which are also standardized by the CCITT (TNE1 with publications G711 and G732) code the telephone signal level with 8 times on 8 bits so as to permit a large number of successive codings and decodings without making the quantization noise disturbing.

Unfortunately, in the presence of high additive noise (case of long radio links and artificial satellite links) the error rate on the bits becomes high and acts in the same way on all the bits, no matter what their weight. This has a particularly prejudicial effect on the high weight bits and particularly sign bits.

Thus, a bit error rate of $10^{-3}$ corresponds to the acceptable threshold for a telephone channel, whilst a bit error rate of $10^{-1}$ would be considered satisfactory with a modulator where all the bits have the same weight (e.g. a "DELTA"-type modulator). These effects are also serious when it is a question of transmitting a data-modulated analog signal.

In connection with these problems, reference can be made to the article by C. BERGER entitled "Choice for digital transmissions: pulse-code modulation or delta modulation" and published in the Journal "L'Onde Electrique", Vol. 59, No. 5, pp. 55 to 62, May 1979.

One solution for this problem consists of coding the complete digital train on transmission, whilst adding redundant bits. However, this solution has a number of disadvantages. Thus, it significantly increases the line throughput, which increases the spectral occupation and no longer permits higher order time multiplexing by hierarchic multiplexers. It makes the decoder operate at high speeds and it only has about 500 nanoseconds to take its decision in the case of a 2.048 Mbit/s system, which causes constructional problems and increases costs. It calls for the use of transmission systems which do not lead to the appearance of error groups, so that the decoder is made inefficient.

BRIEF SUMMARY OF THE INVENTION

The present invention offers another solution to this problem without having the disadvantages of the prior art systems. The invention makes use of the fact that in the case of long radio links and links by artificial satellites there are but few coders-decoders in series. Thus, coding on 8 bits of the telephone channel level becomes superfluous.

According to the present invention, the lowest weight bit (bit No. 8) is not transmitted, but a supplementary bit is introduced, which is a redundant bit of the sign bit, this redundancy permitting a reduction of the sign bit error rate by a factor of 100 to 1000 on reception. This arrangement significantly improves the quality of the telephone channel (voice or data-modulated) without increasing the line throughput, because the number of transmitted bits remains the same. This permits all the hierarchic higher order time multiplexing operations and the reuse of existing ultra-high frequency modulators-demodulators for these hierarchic throughputs.

Moreover, as only one out of 8 bits is coded the decoder works at a speed which is 8 times slower than a decoder for signals with 8 coded bits. Thus, the decoder is less complicated and less expensive than in the prior art, permitting a very considerable integration.

Moreover, the time slots 0 and 16 ensuring the field and multifield locking, the transmission of information and telegraph channels are not modified by the invention. On request, there is also no modification to time slots 5, 13, 21 and 29 if they are used for transmitting data at a speed of 64 kbits/s, this possibility being provided by CCITT.

More specifically, the invention relates to a coder-decoder for the transmission channel of digital signals, the latter being constituted by a sequence of bits between a more significant bit (namely a sign bit) and a less significant bit, wherein it comprises:

(A) coder side:

a circuit able to extract the most significant bit e.g. 1 from the indicated incident digital signal;

a recurrent coding circuit of ratio 2 receiving bit EB1 and supplying two redundant bits EB1a and EB1b;

means for forming a coded digital signal having the same number of bits as the incident signal with bit EB1a as the most significant bit, the least significant bit of the incident signal being eliminated and bit EB1b being inserted between two given bits of the incident signal;

(B) decoder side:

means for extracting the redundant bits EB1a and EB1b from the coded signal;

a recurrent decoding circuit receiving the two bits EB1a and EB1b and supplying a sign bit EB1b;

a pseudo-random bit generator;

means for restoring a digital signal having the signal bits received other than EB1a and EB1b between the sign bit taken as the most significant bit and the pseudo-random bit taken as the least significant bit.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

Figure 1:
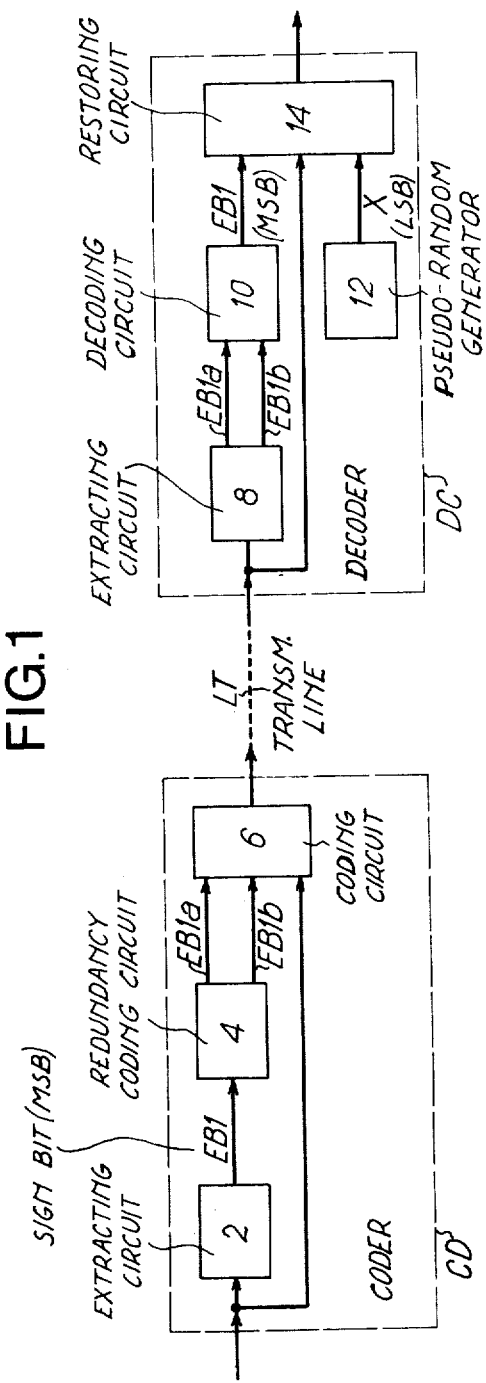
FIG. 1 a block diagram of the device according to the invention.

The device shown in FIG. 1 comprises a coder CD and a decoder DC connected by a transmission line LT, for example a telephone line.

Coder CD comprises a circuit 2 able to extract sign bit EB1 forming the most significant bit from the incident digital signal, a recurrent coder 4 of ratio 2 receiving EB1 and supplying two redundant bits EB1a and EB1b and means 6 for forming a coded digital signal having the same number of bits as the incident signal with as the most significant bit, bit EB1a supplied by circuit 4, the least significant bit of the incident signal being eliminated and with EB1*b* inserted between two given bits of the incident signal.

Decoder DC comprises a circuit 8 for extracting the most significant bit EB1*a* and the inserted bit EB1*b* whose position is known, from the coded signal received, a recurrent decoding circuit 10 receiving EB1*a* and EB1*b* and supplying the sign bit EB1, a pseudo-random generator 12 supplying pseudo-random bits X and means 14 for restoring a digital signal comprising the signal bits received other than EB1*a* and EB1*b* between EB1 taken as the most significant bit and X taken as the least significant bit.

The case of a digital signal with 8 bits EB1 to EB8 is taken for the purpose of describing the operation of the coder-decoder. According to the invention, bit EB1*a* is transmitted in place of the original bit EB1, EB2, EB3 and EB4 are transmitted in their normal position. EB1*b* is delayed by 4 clock strokes and is transmitted in place of the original bit EB5 (which on reception restored independence of errors on EB1*a* and EB1*b*, even in the case of a double line error). EB5, EB6 and EB7 are delayed by 1 clock stroke and are transmitted respectively in place of the original EB6, EB7 and EB8. The least significant bit EB8 is not transmitted.

Figure 2:
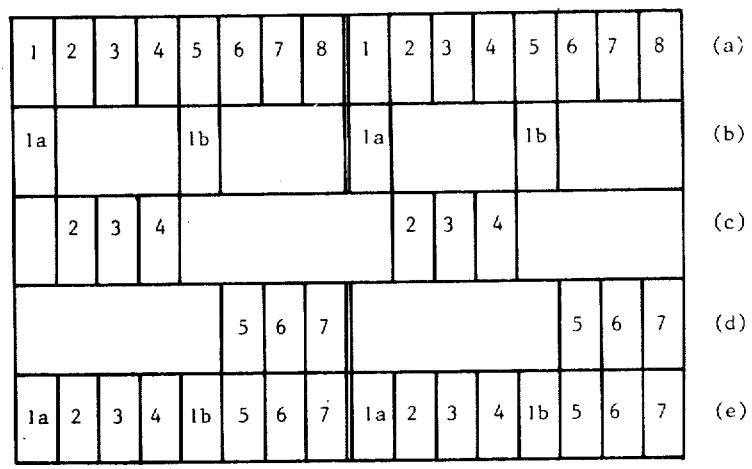
FIG. 2 a timing diagram on transmission.

FIG. 2 is the timing diagram corresponding to these operations:

line (a) represents the structure of the incident digital signal with its 8 bits numbered 1 to 8, line (b) represents the coding of EB1 into EB1*a* and EB1*b*, the rank of the first being maintained, whilst the second is displaced by 4 ranks, so that it coincides with EB5, line (c) represents the bits of ranks 2, 3 and 4 which are unchanged, line (d) shows bits of ranks 5, 6 and 7 displaced by one rank, line (e) illustrates the reconstruction of the digital signal at the coder output by adding the signals of lines (b), (c) and (d).

On reception, the reverse operations are carried out, i.e. extraction of EB1*a* and EB1*b*, decoding with error correction and restoration of EB1 and finally restructuring of a signal with 8 bits after introducing a pseudo-random bit at rank 8.

Figure 3:
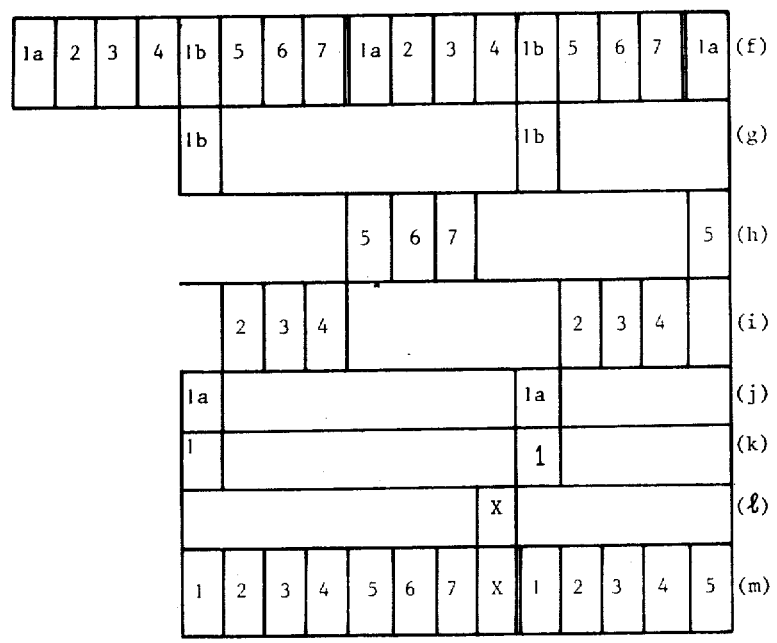
FIG. 3 a timing diagram on reception.

FIG. 3 shows the timing diagram corresponding to these operations:

line (f) represents the digital signal transmitted to the decoder (this signal being identical to that of line (e) of FIG. 2), line (g) represents the extraction of EB1*b* without displacement, line (h) represents the bits of rank 5, 6 and 7, displaced by 3 ranks, line (i) represents the bits of ranks 2, 3 and 4 displaced by 4 ranks, line (j) represents the extraction and displacement by 4 ranks of EB1*a*, line (k) shows the restoration of the sign bit from EB1*a* and EB1*b*, line (l) represents the obtension of a pseudo-random bit X positioned at rank 8, line (m) finally represents the reconstituted signal obtained by adding the signals of lines (h), (i), (k) and (l).

Figure 4:
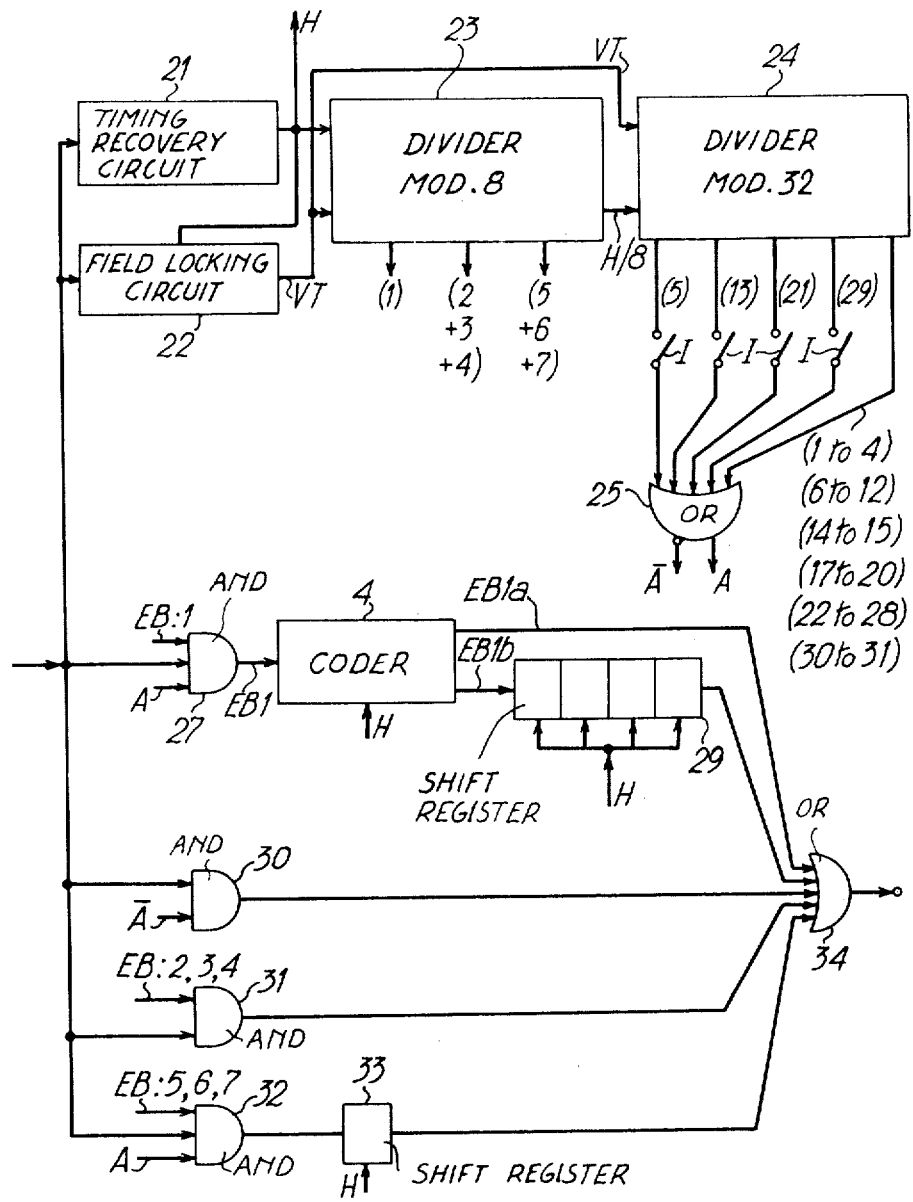
FIG. 4 a diagram of an embodiment of a coder according to the invention.
Figure 5:
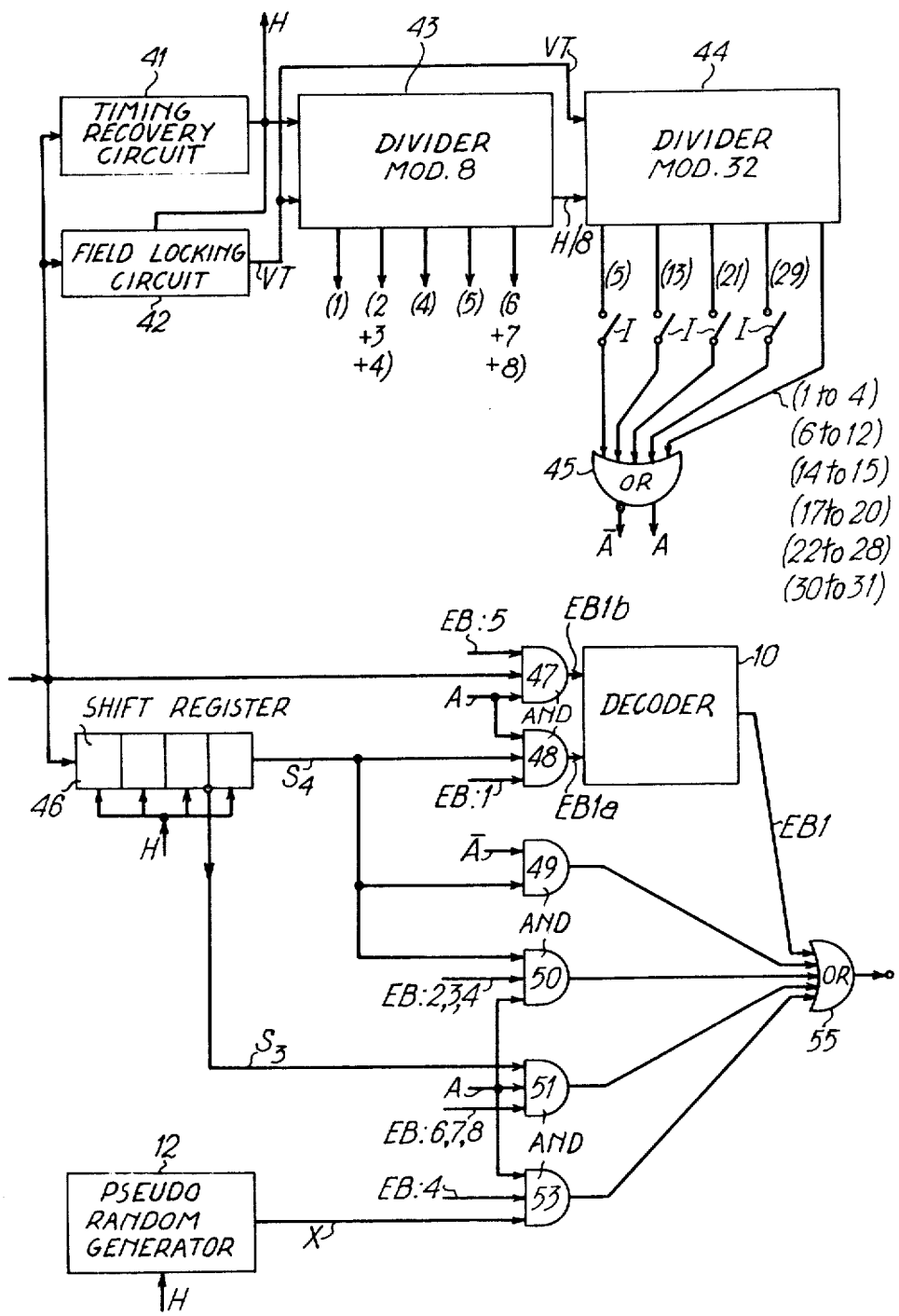
FIG. 5 a diagram of an embodiment of a decoder according to the invention.

FIGS. 4 and 5 illustrate embodiments of a coder and decoder making it possible to perform the aforementioned operations.

The coder shown in FIG. 4 comprises:

a timing signal recovery circuit 21 on which directly acts the input signal and supplies a timing signal H;

a field locking circuit 22 receiving the input signal and the timing signal H from 21 and supplying a field locking signal VT;

a divider 23 modulo 8 receiving the timing signal H with synchronization by signal VT from 22 and supplying a signal H/8, said divider ensuring the distribution of time (bit numbers 1 to 8) grouped as bits 1, 2 3 and 4 and 5, 6, 7, whilst 8 is not used;

a divider 24 modulo 32 receiving signal H/8 from 23 with synchronization by signal VT from 22 and ensuring the distribution with time slots 1 to 4, 6 to 12, 14 to 15, 17 to 20, 22 to 28 and 30 to 31, it being possible to cut out the time slots 5, 13, 21 and 29 by the corresponding switches I. The sum of the information regarding the presence of the slots is obtained by a logic OR gate 25, which supplies information A authorising coding or complementary information $\overline{A}$ forbidding it;

an AND gate 27 with three inputs respectively receiving the input signal, signal A and the number of EB1, a recurrent coder 4 of ratio 2, already mentioned with reference to FIG. 1, which is connected to the output of gate 27 and thus operating in the case of the simultaneous presence of the information "presence of EB1" and "authorisation of coding A", said coder supplying the two redundant bits EB1*a* and EB1*b*;

a shift register 29 with 4 flip-flops receiving EB1 supplied by coder 4 and delaying it by 4 clock strokes;

a logic AND gate 30 with two inputs receiving the signal $\overline{A}$ and the incident signal and, in the presence of information $\overline{A}$, ensuring the transmission, without modification, of the incident signal during time slots 0 and 16 and, on request, during time slots 5, 13, 21 and 29 selected by switches I positioned after divider 24;

a logic AND gate 31 with two inputs receiving the numbers of EB2, 3 and 4 and, without modification, ensuring the transmission of the corresponding bits;

a logic AND gate 32 with three inputs receiving the numbers of bits 5, 6 and 7, signal A and the input signal;

a shift register 33 constituted by a single flip-flop and connected to the output of gate 12, thus ensuring in the case of the simultaneous presence of the information on the numbers of bits 5, 6 and 7 and information A, the transmission of the corresponding bits 5, 6 and 7 with a time lag of one clock stroke;

a logic OR gate 34 ensuring the multiplexing of the bits from circuits 4, 29, 30, 31 and 33 and supplying the coded output signal.

The decoding circuit shown in FIG. 5 comprises:

a circuit 41 for the recovery of the timing signal, said circuit receiving the transmitted signal and supplying a clock signal H;

a field locking circuit 42 receiving the transmitted signal and the clock signal H supplied by circuit 41 and supplying a field locking signal VT;

a divider 43 modulo 8 receiving the clock signal H with synchronization by signal VT from 22 and supplying a signal H/8, said divider ensuring the distribution of the times from 1 to 8 grouped as bits 1, 2, 3 and 4 and 4, 5, 6, 7 and 8;

a divider 44 modulo 32 receiving the signal H/8 from 43 and synchronized by signal VT from 42, said divider ensuring the distribution of the time slots 1 to 4, 6 to 12, 14 to 15, 17 to 20, 22 to 28, 30 and 31, it being possible to cut out slots 5, 13, 21 and 29 by the corresponding switches I'-the sum of the presence information on these time slots is obtained by a logic OR gate 45 supplying information A authorizing decoding and complementary information A' forbidding it;

a shift register 46 constituted by 4 flip-flops receiving the transmitted signal and supplying on a connection $S_4$ a signal delayed by 4 clock strokes and on a connection $S_3$ located after the third flip-flop a signal delayed by three clock strokes;

a logic AND gate 47 with three inputs respectively receiving signal A, the signal corresponding to the fifth rank of the bits and the transmitted signal (said gate supplying the signal $EB1b$);

a logic AND gate 48 with 3 inputs respectively receiving signal A, the signal corresponding to the first rank of the bits and the signal delayed by four clock strokes supplied by register 46, said gate supplying a signal $EB1a$;

the aforementioned recurrent decoder 10 having two inputs connected to the outputs of gates 47 and 48, said decoder reconstituting the sign bit EB1 from $EB1a$ and $EB1b$;

a logic AND gate 49 with two inputs receiving signal A and the signal delayed by four clock strokes carried by connection $S_4$;

a logic AND gate 50 with three inputs receiving the signal A, the signals corresponding to ranks 2, 3 and 4 of the bits and the signal delayed by four clock strokes carried by connection $S_4$;

a logic AND gate 51 with three inputs receiving the signal A, the signals corresponding to ranks 6, 7 and 8 of the bits and the signal delayed by three clock strokes carried by connection $S_3$;

a pseudo-random generator 12, already referred to in connection with FIG. 1, said generator being controlled by the timing signal H and supplying a pseudo-random bit X;

a logic AND gate 53 with three inputs receiving signal A, the signal corresponding to rank 4 of the bits and the pseudo-random bit X;

finally, a logic OR gate with five inputs connected to the outputs of circuit 10, 49, 50, 51, 53, said gate supplying the reconstituted binary signal.

The operation of these circuits is immediately apparent from FIGS. 2 and 3.

In the aforementioned description $EB1b$ is inserted in a slot between the bits of ranks 4 and 5, but it can obviously be inserted elsewhere. For coding purposes, it is generally sufficient to displace by one rank the bits whose rank is below a given rank n and to leave in place the bits with a rank higher or equal to n. This provides a slot at rank n where EB1 can be inserted for coding. On decoding, the displacement of the bits whose rank is equal to or above n must exceed by one clock stroke the displacement of the bits of rank below n in such a way that these two groups of bits are once again contiguous.

It is also obvious that the number of bits constituting the digital signal has been made equal to 8 is only given as an example, the invention being applicable in general terms to any binary signal, no matter what the number of bits.

What is claimed is:

1. A digital transmission circuit comprising a coder, a decoder, and a transmission channel connecting said coder and said decoder, wherein:

(A) said coder comprises:
an extracting circuit having one input receiving an incident digital signal constituted by a sequence of bits between a most significant bit and a least significant bit, and having one output delivering the most significant bit EB1 of said incident digital signal, a first coding circuit having one input connected to said output of said extracting circuit and two outputs supplying two redundant bits $EB1a$ and $EB1b$, equal to said bit EB1, a second circuit having a first input, a second input and a third input, said first and second inputs being connected to the two outputs of said first coding circuit and said third input being connected to the input of said extracting circuit and having one output delivering a coded digital signal having the same number of bits as the incident signal with bit $EB1a$ as the most significant bit, the least significant bit of the incident signal being eliminated and the bit $EB1b$ being inserted between two bits of the incident signal, said output being connected to said transmission channel;

(B) said decoder comprises:
an extracting circuit having one input connected to said transmission channel, and two outputs supplying said redundant bits $EB1a$ and $EB1b$, a decoding circuit having two inputs connected to said two outputs of said extracting circuit and one output supplying a sign bit EB1, a pseudo-random bit generator having one output, a restoring circuit having a first, a second and a third input, said first input being connected to said output of said decoding circuit, said second input being connected to said input of said extracting circuit, said third input being connected to said output of said pseudo-random generator, said restoring circuit having an output supplying a decoded digital signal having said bit EB1 as the most significant bit and said pseudo-random bit as the least significant bit.

2. A circuit according to claim 1, wherein said second coding circuit of said coder comprises a first time lag line having one input connected to the second output of said first coding circuit and receiving said bit $EB1b$ and having one output supplying a bit delayed by n clock strokes, n being an integer.

3. A circuit according to claim 2, wherein said second coding circuit comprises means for receiving said incident digital signal and for delivering on a first output the bits of said incident signal having a weight which is lower than n and on a second output the bits of said incident signal whose weight is not lower than n, and a second time lag line having an input connected to said first output of said means and an output delivering said bits whose weight is lower than n with a delay of one clock stroke.

4. A circuit according to claim 3, wherein said second coding circuit comprises a logic OR gate having a first input connected to the first output of said first coding circuit, a second input connected to said output of said first time lag line, a third input connected to said first output of said means, a fourth input connected to said output of said second time lag line.

5. A circuit according to claim 1, wherein said restoring circuit of said decoder comprises a shift register with n flip-flops, said register having an input connected to said input of said extracting circuit of said decoder, a first output located after said n flip-flops and supplying bits delayed by n clock strokes and a second output located after n−1 flip-flops and supplying bits delayed by n clock strokes.

* * * * *